(12) United States Patent
Chishti et al.

(10) Patent No.: US 8,245,111 B2
(45) Date of Patent: Aug. 14, 2012

(54) PERFORMING MULTI-BIT ERROR CORRECTION ON A CACHE LINE

(75) Inventors: Zeshan A. Chishti, Hillsboro, OR (US); Alaa R. Alameldeen, Aloha, OR (US); Chris Wilkerson, Portland, OR (US); Wei Wu, Hillsboro, OR (US); Dinesh Somasekhar, Portland, OR (US); Muhammad Khellah, Tigard, OR (US); Shih-Lien Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 917 days.

(21) Appl. No.: 12/331,255

(22) Filed: Dec. 9, 2008

(65) Prior Publication Data

US 2010/0146368 A1 Jun. 10, 2010

(51) Int. Cl.
*G06F 11/00* (2006.01)
(52) U.S. Cl. .................................. 714/766; 714/752
(58) Field of Classification Search .................. 714/752, 714/766
See application file for complete search history.

(56) References Cited

U.S. PATENT DOCUMENTS

| | | | | |
|---|---|---|---|---|
| 3,634,821 A * | 1/1972 | Bossen et al. | ............... | 714/760 |
| 4,905,188 A * | 2/1990 | Chuang et al. | ............... | 711/128 |
| 5,455,939 A * | 10/1995 | Rankin et al. | ............... | 714/6.2 |
| 5,457,702 A * | 10/1995 | Williams et al. | ............... | 714/760 |
| 5,491,703 A * | 2/1996 | Barnaby et al. | ............... | 714/766 |
| 5,719,888 A * | 2/1998 | Tanzawa et al. | ............... | 714/764 |
| 6,044,478 A * | 3/2000 | Green | ............... | 714/42 |
| 6,098,191 A * | 8/2000 | Yamamoto et al. | ............... | 714/766 |
| 6,463,563 B1 * | 10/2002 | Chen et al. | ............... | 714/768 |
| 6,848,070 B1 * | 1/2005 | Kumar | ............... | 714/758 |
| 7,792,013 B2 * | 9/2010 | Green et al. | ............... | 370/208 |
| 7,805,658 B2 * | 9/2010 | Luk et al. | ............... | 714/766 |
| 2010/0064181 A1 * | 3/2010 | Moyer | ............... | 714/48 |
| 2010/0211853 A1 * | 8/2010 | Madan et al. | ............... | 714/773 |

OTHER PUBLICATIONS

Hsiao, M.Y. et al., Orthogonal Latin Square Codes, 1970, IBM, pp. 390-394.*

* cited by examiner

*Primary Examiner* — Marc Duncan
(74) *Attorney, Agent, or Firm* — Trop, Pruner & Hu, P.C.

(57) ABSTRACT

A processor may comprise a cache, which may be divided into a first and second section while the processor operates in a low-power mode. A cache line of the first section may be fragmented into segments. A first encoder may generate first data bits and check bits while encoding a first portion of a data stream and a second encoder may, separately, generate second data bits and check bits while encoding a second portion of the data stream. The first data bits may be stored in a first segment of the first section and the check bits in a first portion of the second section that is associated with the first segment. The first decoder may correct errors in multiple bit positions within the first data bits using the check bits stored in the first portion and the second decoder may, separately, decode the second data bits using the second set of check bits.

23 Claims, 5 Drawing Sheets

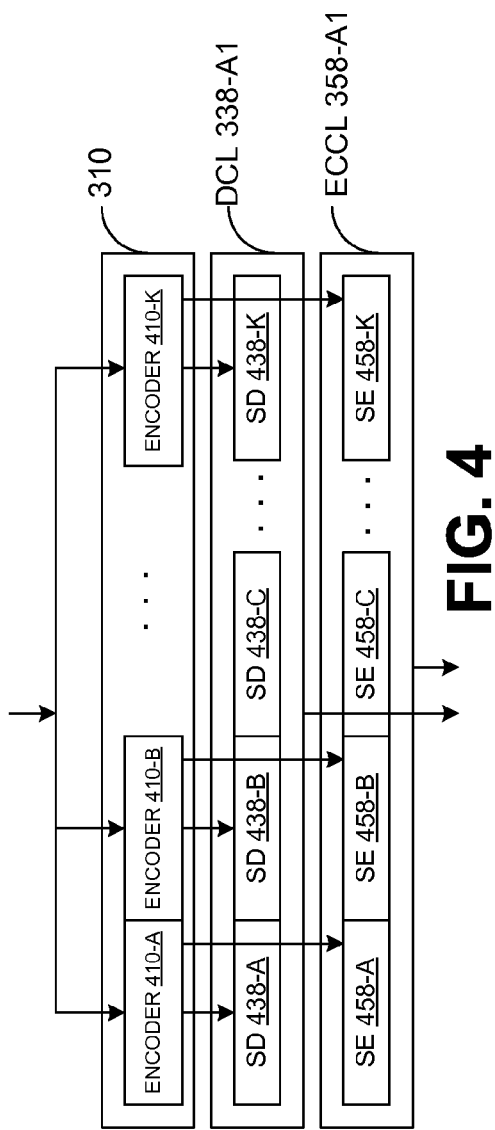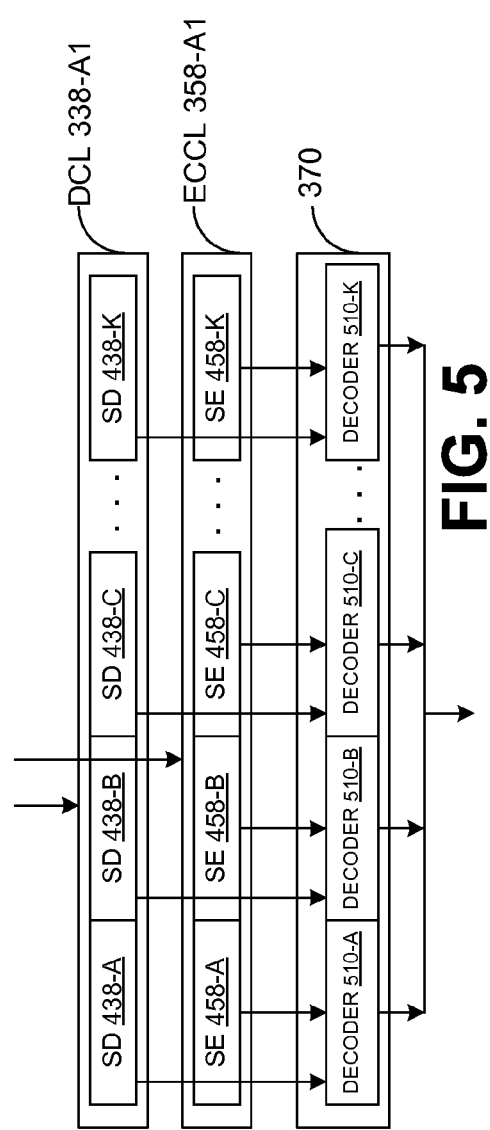

PERFORMING MULTI-BIT ERROR CORRECTION ON A CACHE LINE

BACKGROUND

As semiconductor technology continues to scale, energy efficiency is becoming a key design concern for computer systems. Processors often use multiple power modes to exploit the power-performance tradeoff in order to improve energy efficiency. Many processors support high-performance and low-power modes of operation. While operating in a high-performance mode, the processor uses normal supply voltage and runs at a high frequency to achieve the best performance. However, while operating in low-power mode(s), the processor may operate at a lower frequency and may use lower supply voltages (500 to 600 mv) to conserve energy. Since energy efficiency is becoming a primary design goal for modern processors, current architectures support many features to reduce power consumption.

Reducing supply voltage may be used to reduce power consumption. However, as supply voltage decreases, manufacturing induced parameter variations increase in severity, which may cause circuits to fail. These variations restrict voltage scaling to a minimum value (Vmin), which is the minimum supply voltage for a die to operate reliably. Failures in memory cells typically determine the Vmin for a processor as a whole. Reducing Vmin in the context of memory failures may be an important factor for enabling ultra-tow power mode of operation.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

FIG. 4 illustrates the access logic 150 that is used to perform encoding of data bits of a cache line that may be used to correct multi-bit errors according to one embodiment.

FIG. 5 illustrates the access logic 150 that is used to perform a multi-bit error correction on a cache line while decoding the data according to one embodiment.

DETAILED DESCRIPTION

The following description describes embodiments of a technique to perform multi-bit error correction on a cache line. In the following description, numerous specific details such as logic implementations, resource partitioning, or sharing, or duplication implementations, types and interrelationships of system components, and logic partitioning or integration choices are set forth in order to provide a more thorough understanding of the present invention. It will be appreciated, however, by one skilled in the art that the invention may be practiced without such specific details. In other instances, control structures, gate level circuits, and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors A machine-readable medium may include any mechanism for storing or transmitting information in a form readable by a machine (e.g., a computing device).

For example, a machine-readable medium may include read only memory (ROM); random access memory (RAM); magnetic disk storage media; optical storage media; flash memory devices; electrical, optical, acoustical or other similar signals. Further, firmware, software, routines, and instructions may be described herein as performing certain actions. However, it should be appreciated that such descriptions are merely for convenience and that such actions in fact result from computing devices, processors, controllers, and other devices executing the firmware, software, routines, and instructions.

Figure 1:
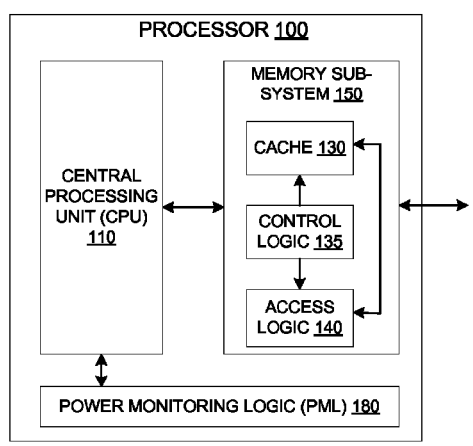
FIG. 1 illustrates a processor 100, which includes a technique to perform a multi-bit error correction on a cache line according to one embodiment.

An embodiment of a processor 100, which may support a technique to perform multi-bit error correction on a cache line is illustrated in FIG. 1. In one embodiment, the processor 100 may comprise a central processing unit (CPU) 110, a memory subsystem 150, and a power monitoring logic (PML) 180. In one embodiment, the PML 180 may sense the activity levels of the components within the processor 100 and may generate signals that may either maintain the processor 100 in high power/performance mode or initiate a low power mode of operation. *In one embodiment, the memory subsystem 150 may comprise a cache 130, control logic 135 and access logic 140. In one embodiment, the processor 100 may operate in 1) high performance mode and 2) low-power mode. White the processor 100 operates in a high performance mode or full supply voltage mode, the cache 130 may be completely used to provide high performance. However, white the processor 100 operates in low-power mode, a first portion of the cache 130 may be used to store data bits and a second portion of the cache 130** may be used to store check bits to correct the errors.

In one embodiment, the control logic 135 may receive a signal from the CPU 110 to extract data from a memory. In one embodiment, the control logic 135 may determine whether the data that is required by the CPU 110 is present in the cache 130. If the data is present ('cache hit') in the cache 130, the control logic 135 may provide (read) the data to the CPU 110. If the data is not present (cache miss) in the cache 130, the control logic 135 may retrieve a block of data (new cache line) from a memory and replace (write), for example, a least recently used cache line (old cache line) with the new cache line. In other embodiment, the control logic 135 may also store (write) the data bits, received from the CPU 110, into cache 130.

In one embodiments while the processor 100 operates in low-power mode, the control logic 135 may divide the cache 130 into one or more sets. In one embodiment, the sets may comprise one or more cache ways, which may be used either as data ways or ECC ways. In one embodiment, the control logic 135 may use a first group of cache ways within a first set as data ways and a second group of cache ways within the first set as ECC ways. In one embodiment, the control logic 135 may partition cache lines of a data way into segments. In one embodiment, the control logic 135 may determine the ratio of data ways to ECC ways in each set based on the level of redundancy desired. In one embodiment, the control logic 135 may initiate a read or a write logic based on the signal received from the CPU 110.

In one embodiment, the access logic 140 may comprise a read and a write logic, which may perform multi-bit error correction on the segments of the cache line of the cache 130. In one embodiment, performing the multi-bit error correction may enable rectification of errors in the memory cells, which may allow the processor 110 to be operated at ultra-low voltage levels (e.g., 500-600 mv). In one embodiment, while operating the processor 100 at ultra-low power levels, a portion (ECC ways) of the sets of the cache 130 may be used to store ECC information of the data ways. Such an approach may enable more errors to be corrected per cache line.

In one embodiment, the segments of the cache line may be encoded or decoded, separately. As the size of the segments may be less than the size of the cache line, the complexity of encoding and decoding logic may be less compared to the encoding and decoding logic used to process un-segmented cache line. Also, as the size of the segments may be less than the size of the cache line, the latency associated with the encoding and decoding logic may be substantially less than the latency associated with the encoding and decoding logic used to process the un-segmented cache line. In one embodiment, the encoding and decoding may be performed using ECC codes such as Orthogonal Latin Square Codes (OLSC), Forward Error Correction (FEC) codes, Low Density Parity Check (LDPC) codes, Reed-Solomon codes.

Figure 2:
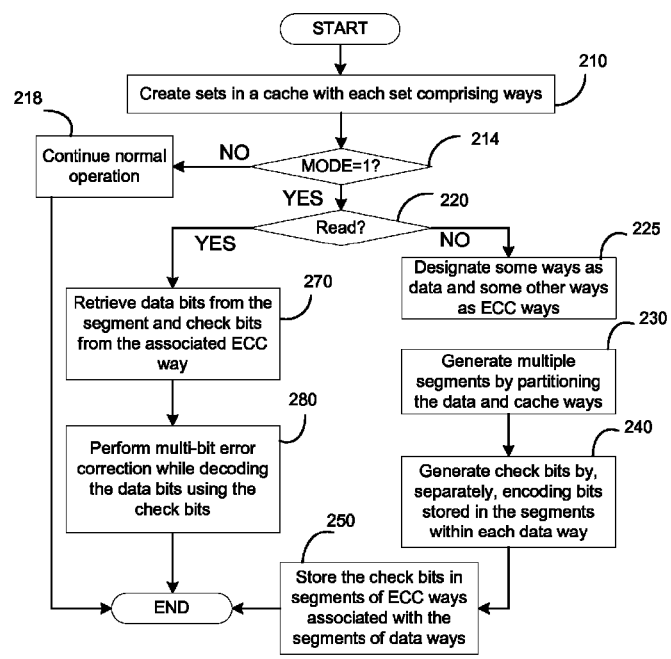
FIG. 2 is a flow-chart illustrating a technique to perform a multi-bit error correction on a cache line according to one embodiment.

A flow-chart depicting a technique to perform the multi-bit error correction in the processor 100 is illustrated in FIG. 2. In block 210, the memory subsystem 150 may create sets within the cache 130 with each set comprising a plurality of ways. In one embodiment, the control logic 135 of the memory subsystem 150 may create N sets such as 340-A to 340-N of FIG. 3. In one embodiment, the control logic 135 may create N sets and ways during the cache initialization phase.

In block 214, the power monitoring logic 180 of the processor 100 may determine if the processor 100 is to be operated in MODE=1 (low power mode) and control passes to block 218 if the processor 100 is to be operated in normal or high power mode and control passes to block 220 if the processor 100 is to be operated in low power mode.

In block 218, the processor 100 may continue with the normal operation. In one embodiment, during the normal operation mode, all the ways of the cache 130 may be used to store data.

In block 220, the processor 100 may check for the type of operation and if the operation is not equal to a Read, control passes to block 225 and to block 270 if the operation is a Read.

In block 225, the memory subsystem 150 may designate some ways with each set as data ways and other ways as ECC ways. In one embodiment, the control logic 135 of the memory subsystem 150 may create N sets (340-A to 340-N) with each set comprising one or more data and ECC ways. In one embodiment, the control logic 135 may divide the cache 130 of size 2 MB, for example, into 4096 sets and each set may comprise eight ways of which four ways may be designated as data ways and four ways may be designated as ECC ways. In one embodiment, the size of the ways may equal the size of the cache line (64 bytes, for example).

In one embodiment, a first set may comprise a first, second, third, and a fourth data way and a first, second third, and a fourth ECC way, while the ratio of data ways to ECC ways is 1:1, However, the ratio of data ways to EGC ways in each set may be equal to G:K. In one embodiment, if the ratio is 1:1; 50% of the cache ways in a set may be used as data ways and the other 50% of cache ways may be used as ECC ways. In one embodiment, during a low power operation, a 2 MB, 8 way cache may be viewed as a 1 MB, 4-way cache. However, in other embodiments, less than or more than 50% of the cache ways may be used as ECC ways.

In block 230, the memory subsystem 150 may generate multiple segments by partitioning the data ways and the ECC ways. In one embodiment, the control logic 135 may partition each of the data ways and ECC ways into segments of finer granularity. In one embodiment, the size of each data way and ECC way may equal 64 bytes (512 bits) and the control logic 135 may partition each of the data ways and the EGC ways into 8 (first to eighth) segments of 64 bits size each.

In block 240, the memory subsystem 150 may generate check bits by, separately and independently, encoding data bits stored in the segments (first to eight) of the data ways. In one embodiment, the check bits for the first segment of the first data way may be generated by encoding the data bits stored in the first segment of the first data way. In one embodiment, while encoding the data bits stored in the first segment of the first data way, the data bits stored in the second, third, and the fourth segments of the first data way may be encoded, separately and independently, using second, third, and fourth encoders, respectively. In one embodiment, as the size of the segment may equal a fraction of the cache line or the data way, the complexity of the encoders may be reduced and also the latency of encoding may be reduced.

In block 250, the memory subsystem 150 may store the check bits in the ECG way associated with the data way. In one embodiment, the check bits generated from the first segment of the first data way may be stored in the first portion of the first ECC way. While the first portion is stored with the check bits generated from the first segment, the check bits generated from the second segment of the first data way may be stored in a second portion of the first ECC way. Likewise, the check bits generated from the third segment of the first data way may be stored in the third portion of the first ECC way, and the check bits generated from the fourth segment of the first data way may be stored in a fourth portion of the first ECG way.

In block 270, the memory subsystem 150 may retrieve data bits from the data ways and check bits from the associated ECC ways. In one embodiment, the block 270 may be reached if a read operation is to be performed. In one embodiment, the memory subsystem 150 may retrieve data bits from the data ways and check bits from the associated ECC way of the sets, separately.

In block 280, the memory subsystem 150 may perform multi-bit error correction while decoding the data bits stored in the segments of the data ways using the check bits stored in the associated portions of the ECC ways. In one embodiment, the memory subsystem 150 may decode the data bits stored in the first segment of the first data way by using the check bits stored in the first portion of the first EGC way. In one embodiment, the memory subsystem 150 may perform multi-bit error correction as a part of the decoding process.

While decoding operation is performed on the first segment of the first data way, a separate set of decoders such as second, third, and fourth decoders may decode the data bits stored in the second segment, third segment, and the fourth segment of the first data way using the check bits stored in the second, third, and the fourth portions of the first ECC way, respectively. As the size of the segments may equal a fraction of the size of the cache line, the complexity of the decoders may be reduced and also the latency of decoding may be reduced.

Figure 3:
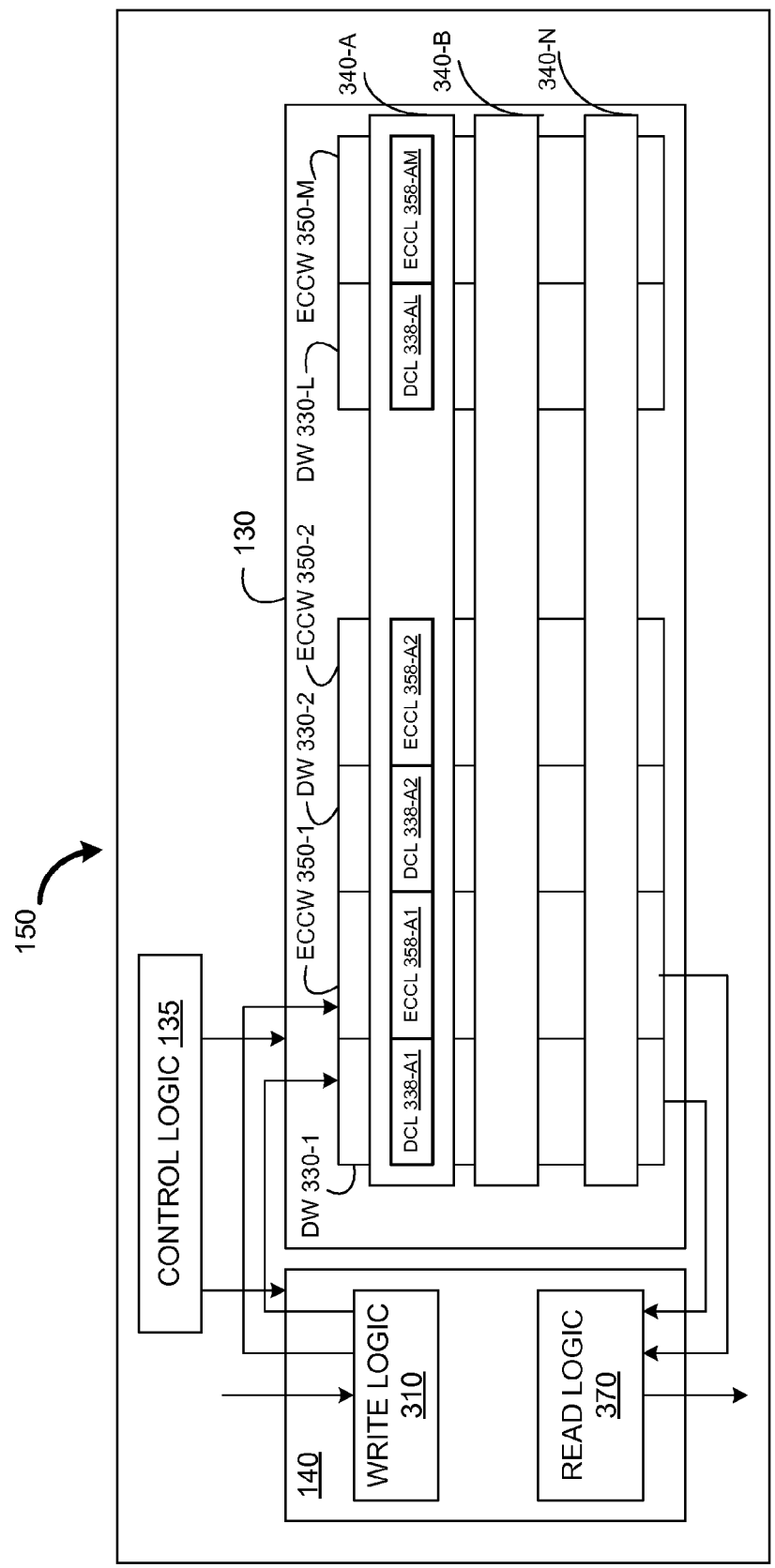
FIG. 3 illustrates a memory sub-system 150, including an access logic 150, to perform a multi-bit error correction on a cache line according to one embodiment.

An embodiment of the memory subsystem 150 supporting a technique to perform multi-bit error correction is illustrated in FIG. 3. In one embodiment, the control logic 135 may partition the cache 130 into a plurality of sets 340-A to 340-N and data ways stack DW 330-1 to DW 330-L and EGC ways stack ECCW 350-1 to ECCW 350-M. In one embodiment, the first set 340-A may comprise data ways DCL 338-A1, DCL 338-A2, DCL 338-A3 to DCL 338-AL and ECC ways 358-A1, ECCW 358-A2, ECCW 358-A3 to ECCW 358-AM. In one embodiment, if the ratio of data ways to ECC ways is equal to 1:1, then L=M. However, for other ratios, L may not be equal to M.

In one embodiment, the ECCL 358-A1 may be used to store the check bits generated by encoding the data bits stored in segments of the DCL 338-A1. In one embodiment, the write logic 310 may comprise one or more encoding logic circuitry and the read logic 370 may comprise one or more decoding logic circuitry. In one embodiment, the DCL 338-A1 may be partitioned into eight segments (first to eighth, for example) and data bits stored in each of the segments of the DCL 338-A1 may be decoded using the check bits stored in portions of the ECCL 358-A1 that are associated with the segments of the DCL 338-A1.

An embodiment of the write logic 310 performing encoding of data bits of a DCL 338-A1 that may be used to correct multi-bit errors is illustrated in FIG. 4. In one embodiment, the DCL 338-A1 may be partitioned into segments SD 438-A to SD 438-K and the ECCL 358-A1 may be partitioned into portions SE 458-A to SE 458-K. In one embodiment, the write logic 310 may comprise encoders 410-A to 410-K.

In one embodiment, the encoder 410-A may encode X1 data bits of the segment SD 438-A. In one embodiment, the SD 438-A may comprise X1=64 bits. In one embodiment, the encoder 410-A may encode X1 data bits of the SD 438-A and may generate X1$d$ (~64) data bits and X1$c$ (~64) check bits.

In one embodiment, the X1$d$ data bits may be stored in the SD 438-A and the X1$c$ check bits may be stored in the SE 458-AS While the encoder 410-A encodes the X1 bits of the SD 438-A, the encoders 410-B to 410-K may, separately, encode X2 to XK (K=8, for example) data bits in each of the segments SD 438-B to 438-K, respectively. In one embodiment, the encoders 410-B may generate X2$d$ data bits and X2$c$ check bits, which may be, respectively, stored in the SD 438-B and SE 458-B. Likewise, the encoders 410-C to 410-K may generate (X3$d$, X3$c$) to (XK$d$, XK$c$) data and check bits each and store the data bits X3$d$ to XK$d$ in the SD 438-C to SD 438-K, respectively and the check bits X3$c$ to XKc in the SE 458-C to SE 458-K, respectively.

An embodiment of the read logic 370 performing multi-bit error correction is illustrated in FIG. 5. In one embodiment, the data bits of each segment of the DCL 358-A1 may be decoded in response to receiving a decode signal from the control logic 135. In one embodiment, the read logic 370 may decode the X1$d$ to XK$d$ data bits stored in the segments SD 438-A to SD 438-K using the check bits X1$c$ to XK$c$ stored in the associated ECC segments 458-A to 458-K. In one embodiment, the read logic 370 may comprise decoders 510-A to 510-K.

In one embodiment, the decoder 510-A may receive X1$d$ (=64) data bits stored in the SD 438-A and may also receive X1$c$ (=64) check bits stored in the SE 458-A and may correct errors at 't' (=4) bit positions among the X1$d$ data bits stored in the SD 438-A. While the decoder 510-A decodes the X1$d$ (=64) bits stored in SD 438-A, the decoders 510-8 to 510-K may, separately, decode the data bits X2$d$ to XK$d$ stored in each of the segments SD 438-8 to SD 438-K using the check bits X2$c$ to XK$c$ stored in the SE 458-B to 458-K, respectively. However, more check bits may be generated while encoding the data bits stored in the segments SD 438-A to SD 438-K to correct more errors while decoding.

Figures 6, 7:
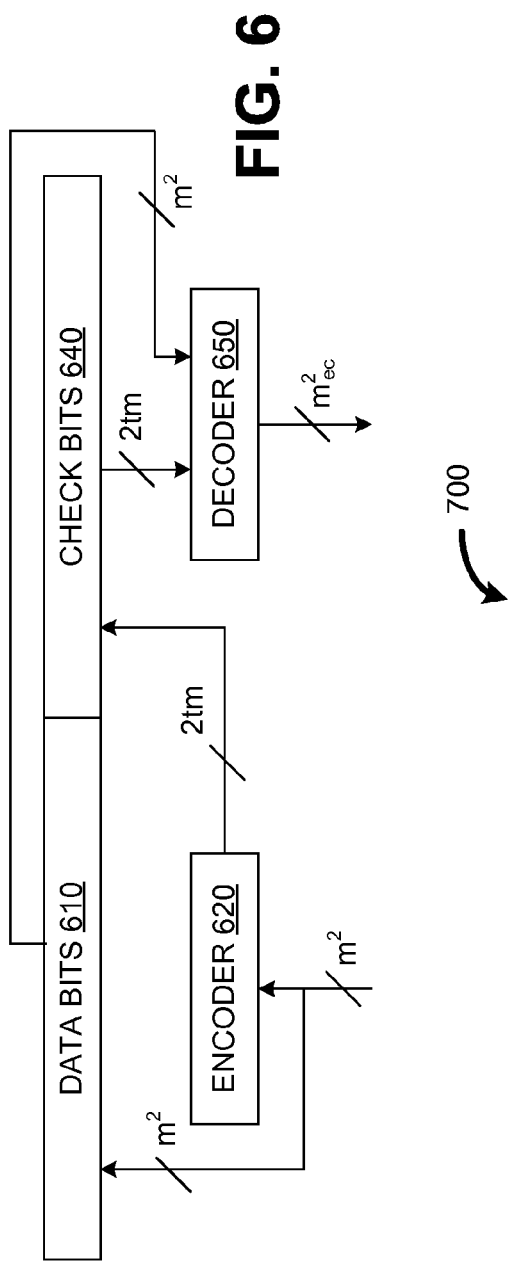
FIG. 6 illustrates use of Orthogonal Latin Square Codes (OLSC) to perform a multi-bit error correction on a cache line according to one embodiment.
FIG. 7 is a table depicting a 16-bit data and check-bits portion used to perform 2-bit error correction using OLSC according to one embodiment.

An embodiment of an access logic 140 performing multi-bit error correction using Orthogonal Latin Square Codes (OLSC) is illustrated in FIG. 6. In one embodiment, an encoder 620 may receive $m^2$ bits from a cache line and generate $m^2$ data bits and 2tm check bits. In one embodiment, 'm' may represent the number of bits that may be used to encode or generate a bit of the check bits. In one embodiment, 'm' (=4, for example) may also represent the square root of the total number (=16) of data bits. In one embodiment, 't' may represent the number of errors that may be corrected. In one embodiment, if m=4, the data bits that may be generated by the encoder may equal 16 (=$4^2$) and if the number of error bits (t) that may be corrected equals 2, the encoder may generate 2tm=16 check bits (=2*2*4). In one embodiment, the data bits may be stored in data bits 610 and the check bits may be stored in check bits 640.

While decoding, the decoder 650 may retrieve data bits (=$m^2$) from data bits 610 and check bits (=2tm) from check bits 640 and generate a decoded output with 2-bit error correction. In one embodiment, the decoder 650 may generate $m_{ec}^2$ error corrected data bits.

A table 700 depicting a 16-bit data stream and check bits that are used to perform 2-bit error correction using OLSC is depicted in FIG. 7. In one embodiment, the table 700 may include data bits 610 and check bits 640 and the data bits 610 may comprise 16 data bits d0-d15 and the encoder 620 may generate check bits 640, which may comprise 16 check bits c0-c15 depicted in row 710.

In one embodiment, the row 711 may comprise data bits d0 to d15 and the encoder 620 may generate a check bit c0 by performing an XOR logical operation of the data bits d0, d1, d2, and d3, which are indicated by 'x'. In one embodiment, c0=XOR (d0, d1, d2, d3)=XOR (0, 1, 1, 1)=1. In one embodiment, the encoder 620 may comprise m-input XOR logic gate to generate each check bit. In one embodiment, the logic complexity of the encoder 620 may be proportional to the square root (m) of the total number of check bits, with a critical path equal to ceil($\log_2(m)$) levels of 2-input XOR gates.

In one embodiment, the data bits used to determine the check bit may be selected using selection criteria. In one embodiment, the selection criteria may be such that any combination of two data bits appears together in utmost one XOR operation. In one embodiment, a check bit $C_i$ (i=0 to 15) may be generated by performing an XOR of the data bits marked by a symbol 'x' in that row. In one embodiment, the number of data bits that may be used to encode a check bit in a particular row may equal the value of 'm'. In one embodiment, the value of 'm' may equal 4 and the number of bits in rows 711 to 726 that may be used to encode the check bits for that row may equal m(=4).

Row 712 comprises data bits d0 to d15 and the data bit position of d4, d5, d6, and d7 may be marked by the symbol 'x' to indicate that d4, d5, d6, and d7 may be used to encode the check bit c1. In one embodiment, the value of c1 may be determined by performing XOR of (d4, d5, d6, d7)=XOR (1, 0, 1, 0)=0. In row 713, the data bits in position d8, d9, d10, and d11 may be used to encode c2 and the value of c2 may be determined by performing XOR of (d8, d9, d10, d11)=XOR (1, 1, 1, 0)=1. In row 714, the data bits in position d12, d13, d14, and d15 may be used to encode c3 and the value of c3 may be determined by performing XOR of (d12, d13, d14, d15)=XOR (0, 0, 0, 0)=0.

Rows 715 to 726 comprise different combination of data bits and check bits generated using the data bits, which may be selected using the selection criteria. In one embodiment, the row 715 may select d0, d4, d8, and d12 (d0=0, d4=1, d8=1, and d12=0) to determine the check bit c4 and c4=XOR of (0, 1, 1, 0)=0. Likewise, the check bits for each 716 to 726 may be encoded by performing an XOR operation of the data bits marked by the symbol 'x' in that row.

In one embodiment, the decoder 650 may retrieve data bits 610 and check bits 640 and using the check bits 640, the decoder 650 may correct the errors in the data bits. In one embodiment, the decoder 650 may use XOR logic gates and a majority voting technique to generate the corrected data bit. In one embodiment, the decoder 650 may comprise a [(2*t+1)=(2*2+1)=5] input majority voter to decode the data bit (di). In one embodiment, the decoder 650 may receive the data bit (di) itself as one input and 2t (=4) inputs derived from check bits that may contain di as the encoding variable.

In one embodiment, the decoder 650 may correct the errors in the input data bits during the decoding process, without requiring additional error correction logic. In one embodiment, the decoder 650 may receive d0, which may equal 1 (instead of 0 that is caused due to error) and correct the error while decoding the data bit d0. In one embodiment, the d0 (=1) may be in error as the d0 may change from 0 to 1 based on various factors such as noise, interference, and cross talk. In one embodiment, the decoder 650 may generate an error corrected data bit D0 in response to receiving d0.

In one embodiment, the decoder 650 may generate D0 after receiving (2*t+1=) 5 inputs. In one embodiment the decoder 650 may receives
1) d0,
2) XOR of c0 (wherein c0 is the first check bit whose encoding requires d0) and d1, d2, d3 (data bits other than d0 used to compute c0),
3) XOR of c4 (wherein c4 is the second check bit whose encoding requires d0) and d4, d8, d12 (the data bits other than d0 used to compute c4),
4) XOR of c8 (wherein c8 is the third check bit whose encoding requires d0) and d5, d10, d15 (the data bits other than d0 used to compute c8), and
5) XOR of c12 (wherein c12 is the fourth check bit whose encoding requires d0) and d6, d11, d13 (the data bits other than d0 used to compute c12).

In one embodiment, the decoder 650 may generate an error corrected data bit D0, which may equal [Majority of (d0, XOR(c0,d1,d2,d3), XOR(c4,d4,d8,d12), XOR(c8,d5,d10, d15), XOR(c12,d6,d11,d13))=Majority of (1, XOR(1,1,1,1), XOR(0,1,1,0), XOR(1,0,1,0), XOR(1,1,0,0))=Majority of [(1,0,0,0,0)=0].

In one embodiment, transient or persistent failures in cache tags may affect the correctness of program execution. In one embodiment, a failure in a tag bit can cause a false positive, which may cause a cache miss to erroneously become a cache hit to a different line. In one embodiment, such an error may cause reading from or writing to a wrong address that may cause corruption of program data. In one embodiment, a tag bit failure may also cause a false negative, which may cause a cache hit to a line in the cache to erroneously become a cache miss. In one embodiment, such an error may cause loss of updated data in a write-back cache.

In one embodiment while the processor 100 operates in a low-power mode, failures may occur frequently and a portion of the data lines may be used. In one embodiment, errors in the tags associated with the used data lines may be avoided by using the unused tags to store the OLSC of the used tags. In one embodiment, the tag associated with a used data line may comprise actual tag bits. In one embodiment, the tag of a ECC line may include OLSC for the associated actual tag of the data line. In one embodiment, the OLSC check bits may be used to encode and decode faster compared to a traditional ECC.

Figure 8:
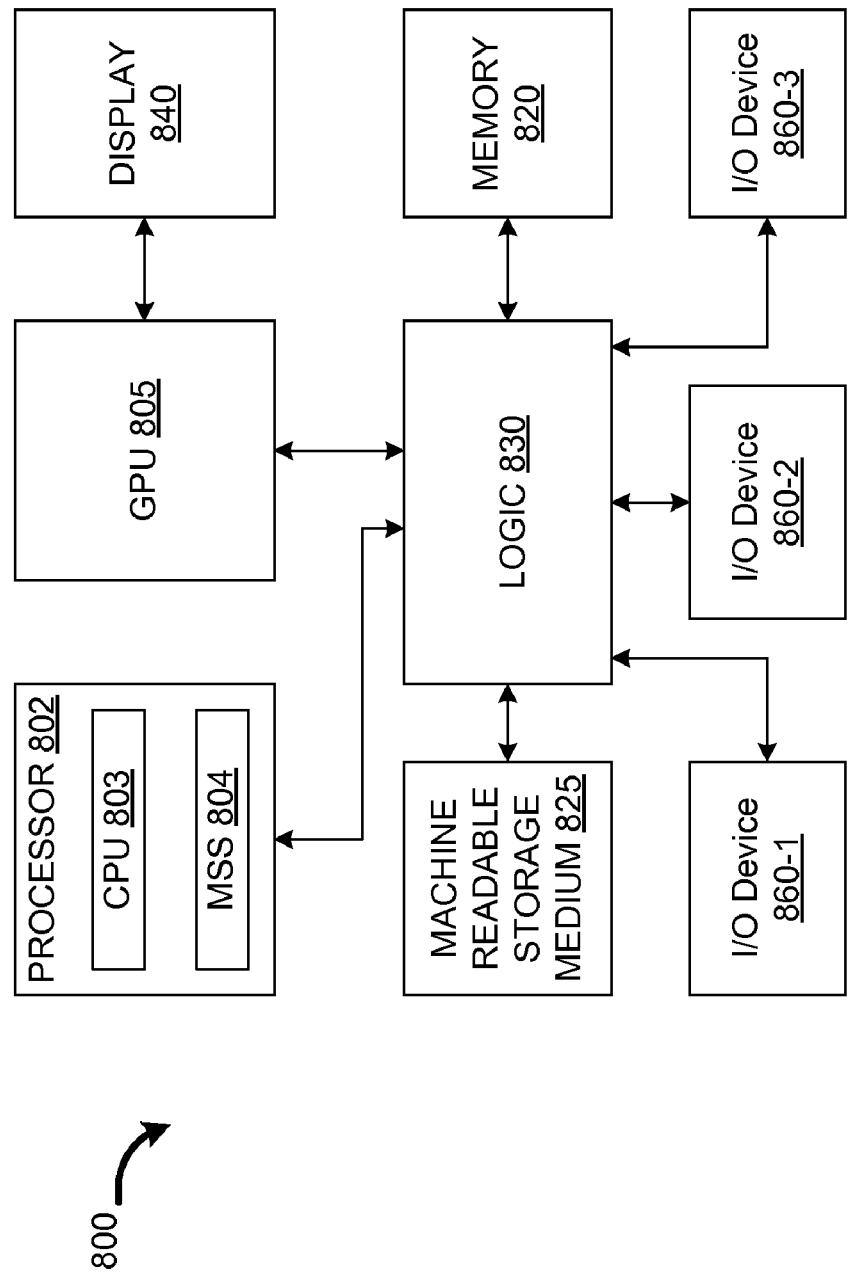
FIG. 8 is a computer system in which multi-bit error correction may be performed according to one embodiment.

Referring to FIG. 8, a computer system 800 may comprise a processor 802, which may include a single instruction multiple data (SIMD), reduced instruction set (RISC), and such other similar general purpose processors and a graphics processor unit (GPU) 805. The processor 802, in one embodiment, may store a sequence of instructions, to provide and process the data bits to perform multi-bit error correction in machine readable storage medium 825. However, the sequence of instructions may also be stored in the memory 820 or in any other suitable storage medium.

The processor 802 that operates the computer system 800 may be one or more processor cores coupled to logic 830. In one embodiment, the processor 810 may comprise a central processing unit 803 and a memory subsystem MSS 804. In one embodiment, the memory subsystem may perform multi bit error correction by portioning the cache lines of a cache into segments. In one embodiment, while the computer system 800 is operating in a low-power mode, the memory subsystem may generate check bits while encoding the data bits and store the check bits in a portion of the cache and while decoding, the memory sub-system may decode the data bits using the check bits stored in the cache. In one embodiment, while decoding the data bits, multi-bit errors may also be corrected. In one embodiment, the encoding of data bits may be performed separately by each of the encoders associated with the segment. Also, decoding of data bits stored in each of the segment may be performed separately by a decoder associated with each segment.

The logic 830, for example, could be chipset logic in one embodiment. The logic 830 is coupled to the memory 820, which can be any kind of storage, including optical, magnetic, or semiconductor storage. The I/O devices 860 may allow the computer system 800 to interface with the devices such as network devices or users of the computer system 800.

Certain features of the invention have been described with reference to example embodiments. However, the description is not intended to be construed in a limiting sense. Various modifications of the example embodiments, as weal as other embodiments of the invention which are apparent to persons skilled in the art to which the invention pertains are deemed to lie within the spirit and scope of the invention.

What is claimed is:

1. A method comprising:
fragmenting a cache line of a first section of a cache memory into a plurality of segments comprising a first segment and a second segment,
generating a first set of data bits and a first set of check bits while encoding a first region of a data stream,
storing the first set of data bits in the first segment of the first section of the cache memory and the first set of check bits in a first portion of a second section of the cache memory while the cache memory is operational in a low-power mode and otherwise not generating and storing the first set of check bits, wherein the first portion is associated with the first segment of the first section of the cache memory, to enable correcting errors in multiple bit positions within the first set of data bits using the check bits stored in the first portion of the second section of the cache memory while decoding the first set of data bits.

2. The method of claim 1 further comprises,
generating a second set of data bits and a second set of check bits while encoding a second region of the data stream, wherein the second region of the data stream is encoded separately while the first region of the data stream is encoded,
storing the second set of data bits in the second segment and the second set of check bits in a second portion of the second section of the cache memory, wherein the second portion is associated with the second segment, to enable correcting errors in multiple bit positions within the second set of data bits using the check bits stored in the second portion of the second section of the cache memory while decoding the second set of data bits.

3. The method of claim 2, wherein the first set of check bits and the second set of check bits are stored in the second section of the cache memory while the cache memory is operated in the low-power mode.

4. The method of claim 2, wherein encoding of the first region and the second region of the data stream is performed using Orthogonal Latin Square Codes.

5. The method of claim 4, wherein the first set of data bits comprise '$m^2$' data bits and the first set of check bits comprise '2tm' check bits, wherein 'm' represents a number of bits used to generate a check bit of the first set of check bits and 't' represents the number of correctible error bits.

6. The method of claim 5, wherein the decoding comprises generating '$m^2$' data bits that are corrected for errors in 't' positions within the first set of data bits.

7. The method of claim 1, wherein the ratio of the size of the first section and the second section of the cache memory is equal to G:K, wherein G is not equal to K, wherein G and K are integers.

8. The method of claim 1, wherein the ratio of the size of the first section and the second section of the cache memory is equal to G:K, wherein G is equal to K, wherein G and K are integers.

9. A machine-readable non-transitory storage medium comprising a plurality of instructions that in response to being executed result in a processor comprising:
fragmenting a cache line of a first section of a cache memory into a plurality of segments comprising a first segment and a second segment,
generating a first set of data bits and a first set of check bits while encoding a first region of a data stream,
storing the first set of data bits in the first segment and the first set of check bits in a first portion of a second section of the cache memory while the cache memory is operational in a low-power mode and otherwise not generating and storing the first set of check bits, wherein the first portion is associated with the first segment, to enable correcting errors in multiple bit positions within the first set of data bits using the check bits stored in the first portion of the second section of the cache memory while decoding the first set of data bits.

10. The machine-readable non-transitory storage medium of claim 9 further comprises,
generating a second set of data bits and a second set of check bits while encoding a second region of the data stream, wherein the second region of the data stream is encoded while the first region of the data stream is encoded,
storing the second set of data bits in the second segment and the second set of check bits in a second portion of the second section of the cache memory, wherein the second portion is associated with the second segment, and
correcting errors in multiple bit positions within the second set of data bits using the check bits stored in the second portion of the second section of the cache memory while decoding the second set of data bits.

11. The machine-readable non-transitory storage medium of claim 10, wherein the first set of check bits and the second set of check bits are stored in the second region of the cache memory while the cache memory is operated in the low-power mode.

12. The machine-readable non-transitory storage medium of claim 10, wherein encoding of the first region and the second region of the data stream is performed using Orthogonal Latin Square Codes.

13. The machine-readable non-transitory storage medium of claim 12, wherein the first set of data bits comprise '$m^2$' data bits and the first set of check bits comprise '2tm' check bits, wherein 'm' represents a number of bits used to generate a check bit of the first set of check bits and 't' represents the number of correctible error bits.

14. The machine-readable non-transitory storage medium of claim 13, wherein the decoding comprises generating '$m^2$' data bits that are corrected for errors in 't' positions within the first set of data bits.

15. The machine-readable non-transitory storage medium of claim 9, wherein the ratio of the size of the first section and the second section of the cache memory is equal to G:K, wherein G is not equal to K, wherein G and K are integers.

16. The machine-readable non-transitory storage medium of claim 9, wherein the ratio of the size of the first section and the second section of the cache memory is equal to G:K wherein G is equal to K, wherein G and K are integers.

17. An apparatus comprising:
a central processing unit, and
a cache memory coupled to the central processing unit including a control logic to create a plurality of sets each comprising at least one data way and at least one ECC way, wherein during a low-power mode of operation the cache memory is to store check bits into the at least one ECC way to enable correction of multi-bit errors in data stored in the at least one data way, and during a non-low-power mode the cache memory is to store data in the at least one data way and the at least one ECC way.

18. The apparatus of claim 17, wherein the control logic is to fragment a cache line of a first section of the cache memory into a plurality of segments comprising a first segment and a second segment.

19. The apparatus of claim 18, further comprising an access logic including a first encoder to generate a first set of data bits and a first set of check bits while encoding a first region of a data stream, wherein the control logic is to store the first set of data bits in the first segment and the first set of check bits in a first portion of a second section of the cache memory, wherein the first portion is associated with the first segment.

20. The apparatus of claim 19, wherein the cache memory further comprises a first decoder, wherein the decoder is to correct errors in multiple bit positions within the first set of data bits using the first set of check bits while decoding the first set of data bits.

21. The apparatus of claim 19, wherein the control logic is to store the first set of check bits in the second section of the cache memory while operated in the low-power mode.

22. The apparatus of claim 19, wherein the ratio of the size of the first section and the second section of the cache memory is equal to G:K, wherein G is not equal to K, wherein G and K are integers.

23. The apparatus of claim 19, wherein the ratio of the size of the first section and the second section of the cache memory is equal to G:K, wherein G is equal to K, wherein G and K are integers.

* * * * *